United States Patent
Choi et al.

(10) Patent No.: US 9,496,483 B2
(45) Date of Patent: Nov. 15, 2016

(54) VIBRATION MODULE BASED ON PIEZOELECTRIC DEVICE

(71) Applicant: WISOL CO., LTD., Osan-si, Gyeonggi-do (KR)

(72) Inventors: Jae Hyung Choi, Suwon-si (KR); Yukihiro Noro, Suwon-si (KR); Yo Sep Choi, Suwon-si (KR); Jung Rae Noh, Seoul (KR)

(73) Assignee: WISOL CO., LTD., Osan-Si, Gyeonggi-Do (KR)

( * ) Notice: Subject to any disclaimer, the term of this patent is extended or adjusted under 35 U.S.C. 154(b) by 394 days.

(21) Appl. No.: 14/012,129

(22) Filed: Aug. 28, 2013

(65) Prior Publication Data

US 2015/0054381 A1 Feb. 26, 2015

(30) Foreign Application Priority Data

Aug. 22, 2013 (KR) ........................ 10-2013-0099392

(51) Int. Cl.
*H01L 41/09* (2006.01)
*H04R 17/00* (2006.01)

(52) U.S. Cl.
CPC ....... *H01L 41/0926* (2013.01); *H01L 41/0933* (2013.01); *H04R 17/005* (2013.01)

(58) Field of Classification Search
CPC ..................... H01L 41/0926; H01L 41/0933; H01L 41/053; H04R 17/00; H04R 17/005; H03H 9/1021; H03H 9/1014
USPC ......... 310/340, 348, 321, 324, 344; 381/190
See application file for complete search history.

(56) References Cited

U.S. PATENT DOCUMENTS

| | | | |
|---|---|---|---|
| 5,155,625 A * | 10/1992 | Komatsu | B60R 1/0602 219/219 |
| 2004/0246313 A1* | 12/2004 | Lim | B41J 2/14233 347/68 |
| 2006/0131731 A1* | 6/2006 | Sato | B81B 7/007 257/704 |
| 2006/0214998 A1* | 9/2006 | Sugahara | B41J 2/14274 347/71 |
| 2007/0186397 A1* | 8/2007 | Lim | B41J 2/161 29/25.35 |
| 2007/0226974 A1* | 10/2007 | Li | B41J 2/055 29/25.35 |
| 2009/0219347 A1* | 9/2009 | Sugahara | B41J 2/14233 347/70 |
| 2010/0033268 A1* | 2/2010 | Iizuka | H03H 9/1014 333/187 |
| 2010/0148636 A1* | 6/2010 | Nishihara | H03H 9/02015 310/365 |

(Continued)

FOREIGN PATENT DOCUMENTS

DE 19744175 * 4/1999
JP 2006-081998 A 3/2006

(Continued)

OTHER PUBLICATIONS

Online English Translation of DE 19744175, Goldschmidt Apr. 22, 1999.*

(Continued)

*Primary Examiner* — Shawki S Ismail
*Assistant Examiner* — Bryan Gordon
(74) *Attorney, Agent, or Firm* — LRK Patent Law Firm

(57) ABSTRACT

A vibration module based on a piezoelectric device includes: a piezoelectric device; a vibration plate connected to one side of the piezoelectric device by a medium of an adhesive and an intermediate material; the intermediate material interposed between the piezoelectric device and the vibration plate; and a molding part formed on the side of the piezoelectric device where the intermediate material is not formed.

6 Claims, 2 Drawing Sheets

(56) References Cited

U.S. PATENT DOCUMENTS

| | | | |
|---|---|---|---|
| 2011/0121688 A1* | 5/2011 | He | H01L 41/1132 310/338 |
| 2011/0157035 A1* | 6/2011 | Woo | G06F 3/016 345/173 |
| 2012/0291933 A1* | 11/2012 | Tanno | B60C 19/002 152/209.18 |

FOREIGN PATENT DOCUMENTS

| | | |
|---|---|---|
| JP | 5012512 B2 | 8/2012 |
| KR | 20-1998-0028138 U | 8/1998 |
| KR | 10-2013-0061751 A | 6/2013 |
| KR | 10-2013-0063317 A | 6/2013 |

OTHER PUBLICATIONS

KIPO Office Action, mailed Nov. 10, 2014, for Korean Patent Application No. 10-2013-0099392 which corresponds to the above-identified U.S. application.

KIPO Office Action, mailed Jul. 8, 2015, for Korean Patent Application No. 10-2013-0099392 which corresponds to the above-identified U.S. application.

* cited by examiner

VIBRATION MODULE BASED ON PIEZOELECTRIC DEVICE

BACKGROUND OF THE INVENTION

Field of the Invention

The present invention relates to a vibration module including a piezoelectric device, and more particularly, to a vibration module including a piezoelectric device, which reinforces durability of the vibration module mounted in speakers, mobile devices, and others and enhances vibration performance.

Background Art

A specific crystal convertible between mechanical energy and electric energy is called a piezoelectric crystal, and a device manufactured by applying the piezoelectric crystal is called a piezoelectric device. When a potential is applied to the piezoelectric crystal, there is a slight change in the form of the crystal, and when a physical pressure is applied to the piezoelectric crystal, there is a potential difference between both sides of the crystal. The piezoelectric crystal is used in some of microphones for converting the mechanical energy of sound waves into an electric signal or crystal oscillators which help in controlling oscillation frequencies using mechanical properties of crystal. A piezo-resonant package is a device that single parts are manufactured in a package form using the piezoelectric device.

Moreover, the piezoelectric device is used in speakers for generating sounds by vibration, actuators, and others. Ceramic-based piezoelectric device is small in size and is operatable at low voltage and low power, and hence, is widely adopted as a device for generating vibration of mobile devices.

FIG. 1 illustrates a conventional vibration module based on a piezoelectric device. In the conventional vibration module, the piezoelectric device and a vibration plate are bonded together with an adhesive, and the vibration plate is connected with the outside (polymer). When the mechanical energy generated by the piezoelectric device is transferred to the vibration plate, the vibration plate vibrates the polymer based on the mechanical energy. So, the mobile devices or others can be vibrated.

However, the conventional vibration module is weak to external shock due to its ceramic properties. Particularly, in case of the mobile device, the conventional vibration module has a problem in that the ceramic-based piezoelectric device is damaged due to a shock applied when a user drops the mobile device to the floor due to the user's carelessness.

Furthermore, when the piezoelectric device is operated, the vibration plate and the piezoelectric device are different in movement from each other due to a difference in material, and thereby, the vibration plate and the piezoelectric device bonded by the adhesive may be separated from each other. Additionally, an external device connected by a contact terminal may be also separated from the piezoelectric device according to vibration of the piezoelectric device.

CITED REFERENCES

Korean Patent Laid-open No. 2013-0063317 (published on Jun. 14, 2013)

SUMMARY OF THE INVENTION

Accordingly, the present invention has been made to solve the above-mentioned problems occurring in the prior arts, and it is an object of the present invention to provide a vibration module based on a piezoelectric device, which enhances durability of the vibration module based on the piezoelectric device. Particularly, the object of the present invention is to provide a vibration module based on a piezoelectric device, which can prevent a damage of the piezoelectric device even by an external shock and restrain a separation of a vibration plate from the piezoelectric device.

It is a further object of the present invention to provide a vibration module based on a piezoelectric device which improves vibration characteristics of the vibration module.

To achieve the above objects, the present invention provides a vibration module based on a piezoelectric device including: a piezoelectric device; a vibration plate connected to one side of the piezoelectric device by a medium of an adhesive and an intermediate material; the intermediate material interposed between the piezoelectric device and the vibration plate; and a molding part formed on the side of the piezoelectric device where the intermediate material is not formed.

In this instance, the intermediate material is made of one selected from silicon, urethane, polymer and rubber, and the molding part is formed only a part of one side of the piezoelectric device. The molding part is formed in an area which corresponds to 20 percent to 40 percent of an area of the piezoelectric device.

The thickness of the intermediate material of the vibration module is in the range of 0.11 mm to 0.13 mm, and the thickness of the molding part is in the range of 0.5 mm to 0.8 mm.

In the meantime, the vibration module based on the piezoelectric device further includes a contact terminal disposed on the lower side of the piezoelectric device for electrically connecting the piezoelectric device with the outside, and the contact terminal is surrounded by the molding part in a state where the contact terminal is electrically connected with the outside.

The molding part is made of one selected from silicon, urethane, polymer and rubber, and the adhesive is an epoxy-based adhesive with elastic modulus of less than 3000 Mpa.

As described above, the vibration module based on the piezoelectric device according to the present invention can enhance durability of the vibration module, secure stability in operation of the vibration module because the piezoelectric device and the vibration plate are firmly combined.

Particularly, in the case that the vibration module according to the present invention is applied to a mobile device which is easily exposed to the external shock, it shows higher durability than the conventional vibration module and can improve vibration characteristics.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Reference will be now made in detail to the preferred embodiment of the present invention with reference to the attached drawings.

Figure 2:
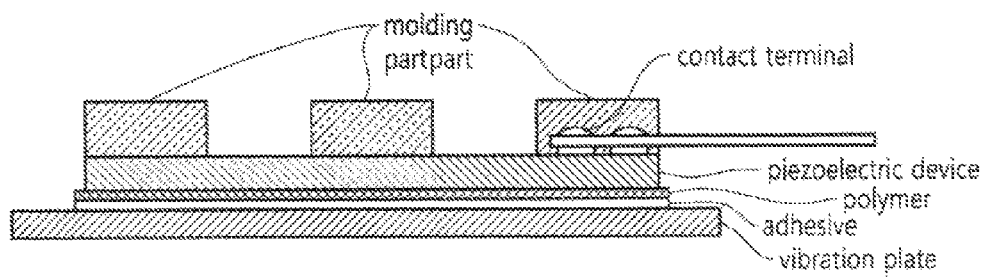
FIG. 2 is a sectional view showing a vibration module based on a piezoelectric device according to a preferred embodiment of the present invention.

FIG. 2 is a sectional view showing a vibration module based on a piezoelectric device according to a preferred embodiment of the present invention.

Figure 1:
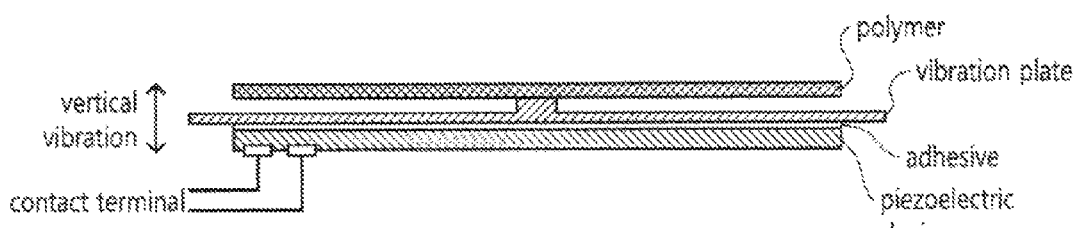
FIG. 1 is a sectional view showing a conventional vibration module based on a piezoelectric device.

The vibration module based on the piezoelectric device according to the present invention includes: a piezoelectric device; a vibration plate connected to one side of the piezoelectric device by a medium of an adhesive and an intermediate material; the intermediate material interposed between the piezoelectric device and the vibration plate; and a molding part formed on the side of the piezoelectric device where the intermediate material is not formed. Compared with the structure of the conventional vibration module illustrated in FIG. 1, the vibration module according to the present invention further includes the intermediate material interposed between the vibration plate and the piezoelectric device and the molding part formed on the piezoelectric device.

In order to keep the vibration characteristics of the vibration module and enhance durability, the vibration module according to the present invention has the intermediate material and the molding part. The intermediate material and the molding part are made of a material that is high in shock absorption rate but keeps the vibration characteristics of the vibration module, and in the present invention, the intermediate material is made of one selected from silicon, urethane, polymer and rubber. Moreover, the molding part is also made of one selected from silicon, urethane, polymer and rubber. The vibration module based on the piezoelectric device is enhanced in durability due to the properties of the above-mentioned materials.

An epoxy-based adhesive with elastic modulus of less than 3000 Mpa can keep its adhesive force and absorb stress due to the external shock. As a result, the vibration plate and the piezoelectric device can be firmly combined together, and because the combination is kept for a long time, the lifespan of the vibration module can be extended (the conventional vibration module has the problem in that the vibration plate is frequently separated from the piezoelectric device during the use). The use of such an adhesive belongs to the scope of the present invention.

Figure 3:
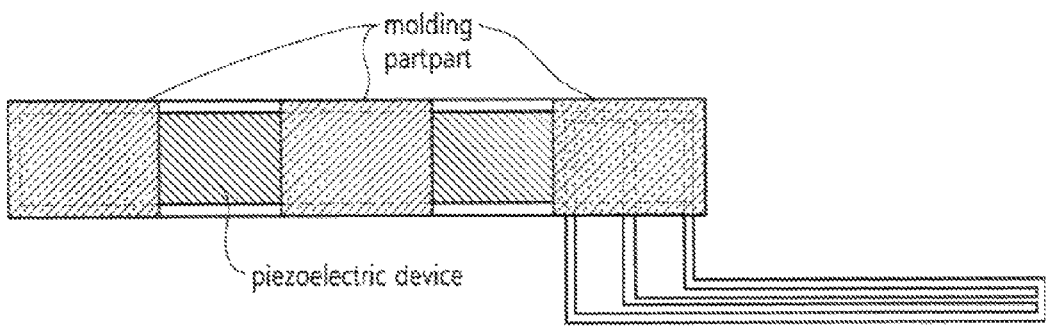
FIG. 3 is a plan view of the vibration module based on the piezoelectric device according to the present invention.

In the meantime, in order to reinforce a combining force between the vibration module and electronic components, such as substrates, which are mounted together with the vibration module, the molding part is formed in the form of surrounding a contact terminal for electrically connecting the piezoelectric device with the outside. It is clearly illustrated in FIGS. 2 and 3. FIG. 3 is a plan view of the vibration module based on the piezoelectric device according to the present invention. Referring to FIG. 2, the molding part surrounds the contact terminal. In the case of the conventional vibration module, the contact terminal and the external element (or a conducting wire) are fixed just by soldering work. However, in this case, it has a disadvantage in that the combining force becomes weaker whenever the vibration module is vibrated. However, the present invention has the molding part formed on the contact terminal can relieve shock and reinforce the combining force among the components.

In another preferred embodiment of the present invention, the molding part may be formed only at a part of one side of the piezoelectric device. The molding part can relieve shock transferred to the vibration module, especially, the piezoelectric device, but on the contrary, vibration of the vibration module is restrained by the molding part, and it causes deterioration in performance of the vibration module.

Therefore, in the preferred embodiment of the present invention, the molding part is formed only at a part of one side of the piezoelectric device.

The following [Table 1] shows durability and performance according to the degree of formation of the molding part.

| Division | Molding rate(%) | Damage due to drop | Maximum vibration displacement(mm) |
|---|---|---|---|
| Non-molding | 0 | 1 | 0.543 |
| Molding on the whole | 100 | 20 | 0.120 |
| Partial molding | 30 | 15 | 0.460 |

The-above test is to measure durability (damage due to drop) and vibration characteristics (maximum vibration displacement) of the vibration module which has no molding part, the vibration module which has the molding part formed on the whole of one side of the piezoelectric device, and the vibration module which has the molding part formed on a part of the piezoelectric device.

In order to measure durability, the above-mentioned vibration modules were attached to jigs for testing a drop and fell free from a height of 1 m, and damages of the vibration modules were determined through the procedures of measuring electrostatic capacities of the vibration modules and checking them with naked eyes.

First, in case of durability, the conventional vibration module which has no molding part was damaged by just one drop. On the other hand, the vibration module which has the molding part on the whole of one side of the piezoelectric device was damaged after twenty drops. Meanwhile, the vibration module according to the preferred embodiment (partial molding) of the present invention was damaged after fifteen drops. In other words, durability was measured higher in order of entire molding>partial molding>non-molding (conventional vibration module). In the meantime, there was no difference in durability between the entire molding and the partial molding, but there was a great difference in durability between molding and non-molding (namely, comparison of partial molding of the present invention with non-molding of the conventional vibration module).

In an aspect of performance of the vibration module, in case of non-molding, by 100 Vp-p driving voltage, the maximum vibration displacement was 0.543 mm, but in case of the entire molding, the maximum vibration displacement was 0.120 mm, and in case of the partial molding, the maximum vibration displacement was 0.460 mm.

The maximum vibration displacement in case of the entire molding was a numerical value which could not be used as a vibration module. However, compared with the non-molding, in the case of the partial molding, the maximum vibration displacement was reduced by 15 percent, and it was a sufficient value to show the function of the vibration module.

As a result of the test, compared with the conventional vibration module, the vibration module with partial molding according to the present invention could keep the function as the vibration module and enhanced durability more than 15 times.

Particularly, in the case that the molding part is formed in an area which corresponds to 20 percent to 40 percent of an area of the piezoelectric device, preferably, near 30 percent of the piezoelectric device area, reduction of the vibration characteristics can be minimized and effectively enhance durability. The area of the molding part is proportional to durability but is inversely proportional to vibration characteristics. Finally, it is necessary to set the optimum range to enhance durability and keep the vibration characteristics at more than specific standard numerical value. As a result of the test, the optimum performance was shown when the area of the molding part was located near 30 percent of the piezoelectric device area.

In the meantime, thickness of the melding part is in the range of 0.5 mm to 8 mm. The vibration characteristics of the vibration module are changed according to not only the area but also the thickness of the molding part. The result that the vibration characteristics were measured and analyzed according to the thickness of the molding part is illustrated in FIG. 4.

Figure 4:
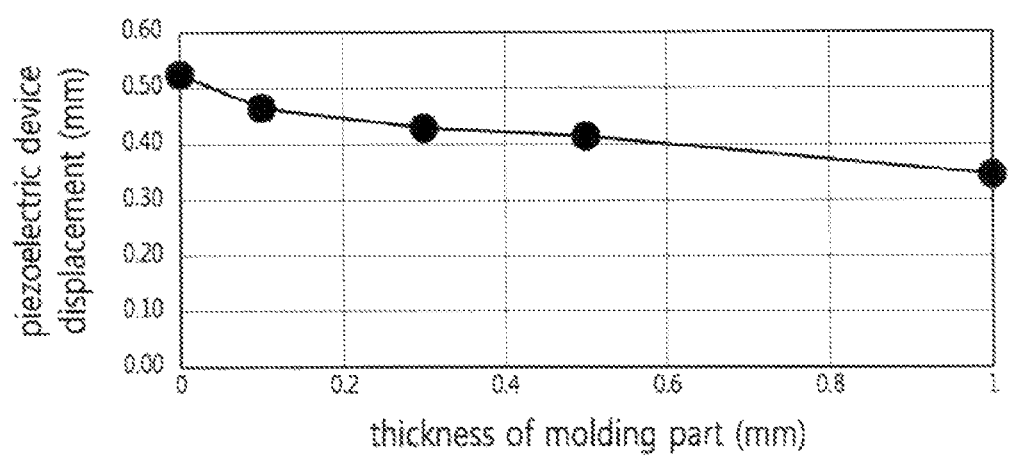
FIG. 4 is a graph showing vibration characteristics of the vibration module based on the piezoelectric device according to the present invention.

FIG. 4 is a graph showing vibration characteristics of the vibration module based on the piezoelectric device according to the present invention. Referring to FIG. 4, when the molding part becomes thicker, the maximum vibration displacement of the piezoelectric device is reduced. Meanwhile, when the molding part becomes thicker, durability of the piezoelectric device is reinforced more. Durability is proportional to the thickness of the molding part but performance is inversely proportional to the thickness, and hence, durability and performance are in relation of conflict. Therefore, in order to satisfy the threshold vibration displacement sufficient to be used as the vibration module and maximize durability, in the present invention, the thickness of the molding part is in the range of 0.5 mm to 0.8 mm.

While the present invention has been particularly described with reference to attached drawings, it will be understood by those of ordinary skill in the art that all changes, modifications and equivalents of the present invention belong to the scope of the present invention without departing from the technical idea of the present invention.

What is claimed is:

1. A vibration module based on a piezoelectric device, comprising:
   a piezoelectric device;
   a vibration plate connected to a lower side of the piezoelectric device by a medium of an adhesive and an intermediate material;
   the intermediate material interposed between the piezoelectric device and the vibration plate to absorb a shock transferred to the piezoelectric device, thereby enhancing durability of the vibration module;
   a molding part formed on an upper side of the piezoelectric device which is opposite to the lower side of the piezoelectric device where the intermediate material is formed; and
   a contact terminal disposed on the upper side of the piezoelectric device to electrically connect the piezoelectric device to an external element,
   wherein the molding part is only formed on a part of the upper side of the piezoelectric device to absorb a shock transferred to the piezoelectric device and enhance vibration characteristics of the vibration module,
   wherein the molding part of the upper side of the piezoelectric device corresponds to 20 to 40 percent of an area of the piezoelectric device,
   wherein the contact terminal is surrounded by the molding part while the contact terminal is being electrically connected to the external element.

2. The vibration module according to claim 1, wherein the intermediate material is made of one selected from among silicon, urethane, polymer and rubber.

3. The vibration module according to claim 1, wherein the thickness of the intermediate material is in the range of 0.11 mm to 0.13 mm.

4. The vibration module according to claim 1, wherein the thickness of the molding part is in the range of 0.5 mm to 0.8 nm.

5. The vibration module according to claim 1, wherein the molding part is made of one selected from among silicon, urethane, polymer and rubber.

6. The vibration module according to claim 1, wherein the adhesive is an epoxy-based adhesive with elastic modulus of less than 3000 Mpa.

* * * * *